(12) United States Patent
Ammar et al.

(10) Patent No.: US 6,922,110 B2
(45) Date of Patent: *Jul. 26, 2005

(54) PHASE LOCKED LOOP (PLL) FREQUENCY SYNTHESIZER AND METHOD

(75) Inventors: Danny F. Ammar, Windermere, FL (US); Ronald D. Graham, Clermont, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/884,254

(22) Filed: Jul. 2, 2004

(65) Prior Publication Data

US 2004/0232996 A1 Nov. 25, 2004

Related U.S. Application Data

(63) Continuation of application No. 10/267,027, filed on Oct. 7, 2002, now Pat. No. 6,759,910.
(60) Provisional application No. 60/383,866, filed on May 29, 2002.

(51) Int. Cl.[7] .............................. H03L 7/07; H03L 7/16
(52) U.S. Cl. ............................. 331/2; 331/16; 331/17; 331/18; 331/68
(58) Field of Search .......................... 331/2, 10, 16–18, 331/25, 38, 68, 69; 332/127; 327/147–150; 360/51; 375/376; 455/260

(56) References Cited

U.S. PATENT DOCUMENTS

| | | | |
|---|---|---|---|
| 5,144,254 A | 9/1992 | Wilke | 328/14 |
| 5,150,078 A | 9/1992 | Yang et al. | 331/2 |
| 5,572,167 A | 11/1996 | Alder et al. | 331/2 |
| 5,940,457 A | 8/1999 | Dreifuss et al. | 375/376 |
| 6,104,250 A | 8/2000 | Eckersten et al. | 331/2 |
| 6,118,316 A | 9/2000 | Tamamura et al. | 327/156 |
| 6,172,579 B1 | 1/2001 | Dacus et al. | 332/128 |
| 6,252,465 B1 | 6/2001 | Katoh | 331/25 |
| 6,759,910 B2 * | 7/2004 | Ammar et al. | 333/2 |

FOREIGN PATENT DOCUMENTS

| | | | | |
|---|---|---|---|---|
| EP | 0 665 651 | 8/1995 | | H03L/7/197 |
| GB | 2 179 512 A | 3/1987 | | H03L/7/22 |
| WO | WO 00/02317 | 1/2000 | | H03L/7/089 |

OTHER PUBLICATIONS

Patent Abstracts of Japan, vol. 2000, No. 19, Jun. 5, 2001 and JP 2001 053607A (Fujitsu Ltd.), Feb. 23, 2001, one page.

* cited by examiner

*Primary Examiner*—David Mis
(74) *Attorney, Agent, or Firm*—Allen, Dyer, Doppelt, Milbrath & Gilchrist, P.A.

(57) ABSTRACT

A phase locked loop (PLL) frequency synthesizer generates a high frequency signal by generating an output signal from a voltage controlled oscillator of a primary phase locked loop (PLL) circuit. The voltage controlled oscillator output is programmably divided with a reference signal output at a divide ratio such that the outputs are equal to a common phase comparison frequency. An external reference signal used for the primary phase locked loop circuit is isolated by generating a voltage controlled, clean reference signal and filtering and synchronizing the clean reference signal with the external reference signal within a secondary phase locked loop circuit to produce the reference signal output to the primary phase locked loop circuit.

20 Claims, 3 Drawing Sheets

PHASE LOCKED LOOP (PLL) FREQUENCY SYNTHESIZER AND METHOD

RELATED APPLICATION

This application is a continuation of Ser. No. 10/267,027 filed Oct. 7. 2002 U.S. Pat. No. 6,759,910, which is based on provisional patent application Ser. No. 60/383,866 filed May 29, 2002, the disclosures of which are hereby incorporated by reference in their entirety.

FIELD OF THE INVENTION

This invention relates to phase locked loop (PLL) frequency synthesizers, and more particularly, this invention relates to phase locked loop (PLL) frequency synthesizers that generate high frequency signals for microwave and millimeter wave radar and telecommunications equipment by using an external reference clock signal.

BACKGROUND OF THE INVENTION

In many telecommunication systems and electronic testing instruments, a frequency synthesizer uses a phase locked loop (PLL) circuit to generate a continuous wave signal at a precise and stable frequency. These types of phase locked loop circuits are well known to those skilled in the art, and usually include a tunable voltage controlled oscillator (VCO) having an output signal that is locked to a known reference signal by a phase detector. Any output voltage is typically related to the phase difference between a reference signal and the voltage controlled oscillator output signal. The phase detector output is coupled back to the input of the voltage controlled oscillator in a feedback loop to tune and lock the voltage controlled oscillator at a desired frequency. Thus, the phase and frequency of any final output signal from the voltage controlled oscillator has the same phase and frequency as the reference signal.

Programmable divider circuits are also used in the feedback loop between the voltage controlled oscillator and the phase detector to divide the voltage controlled output signal by a factor "N". Supplemental divider circuits can divide the reference frequency by a factor "M". By programming the value of the ratio "N" and "M", the voltage controlled oscillator output signal can be made equal to a desired multiple of the reference frequency.

In some prior art frequency synthesizer devices, digitally programmable continuous wave signals are generated by phase locked loop frequency synthesizers using a programmable divider operative with the reference signal. Other frequency synthesizers generate digitally programmable, continuous wave signals using digital rate multipliers and digital dividers. Rate multiplier circuits sometimes are used to program the reference frequency by suppressing pulses of a reference signal to various program values. Spur filters are sometimes operatively connected to phase detectors and a voltage controlled oscillator to reduce spurious FM side bands. Mixers can be interposed in the feedback path to shift and extend the set of frequencies that can be generated by the phase locked loop frequency synthesizer.

It is also well known that phase locked loop frequency synthesizers are commonly used to generate high frequency sources for microwave and millimeter wave radar and telecommunications equipment. The high frequency source, also known as the Local Oscillator (LO), is used to up-convert low frequency transmitter signals to high frequency RF signals, or down-convert received RF signals to lower frequencies. Traditionally, phase locked loop frequency synthesizers have used an accurate, relatively spur free, crystal oscillator reference typically found to be in the range of about 10 to about 100 MHz. The phase noise and spur levels of a reference clock signal are very critical, because at the output of a voltage controlled oscillator, any spurious signals are multiplied by the ratio of the voltage controlled oscillator to the phase comparison frequency. This directly impacts the performance of the closed phase locked loop circuit.

As is known to those skilled in the art, a typical phase locked loop circuit compares the phase of the divided reference clock, with that of the divided voltage controlled oscillator output signal. Any error detected in the phase between the signals is converted to a voltage that is used to correct the voltage controlled oscillator phase error. The correction voltage is applied through a filter to reduce spurious signals in the output signal, and improve the close-in, phase noise performance of the phase locked loop circuit. The loop bandwidth is typically established wide enough to reject the close-in noise of the voltage controlled oscillator, but narrow enough to reduce spurious signal levels in the signal output, thus, yielding an optimized noise spectrum that is better than that of the voltage controlled oscillator alone.

SUMMARY OF THE INVENTION

It is an object of the present invention to provide a phased locked loop frequency synthesizer that can operate with a corrupted external reference clock and generate a spur-free output.

It is yet another object of the present invention to provide a phase locked loop frequency synthesizer that overcomes the drawbacks of the prior art as described above.

The present invention provides a novel and unobvious phase locked loop frequency synthesizer and method for generating microwave and millimeter wave signals by implementing a voltage controlled, oscillator-based, phase locked loop frequency synthesizer that can operate with a corrupted external reference clock, and yet generate a very accurate and relatively spur free output signal. The present invention is advantageous for wireless terrestrial and satellite communications where the transmission and reception sources are synchronized with a reference signal that has been recovered from received communications data, which may have been corrupted with noise and spurious signals. The circuit and method of the present invention provide faster lock times than a comparable and typical frequency locked loop circuit.

The present invention generates a relatively spur free, high frequency, local oscillator signal using a corrupted reference clock signal and isolates the corrupted reference clock signal from the frequency synthesizer circuits. The present invention prevents corruption of the frequency source. The voltage controlled oscillator output frequency can be multiplied to generate higher frequency local oscillator signals with very low spurious and harmonic signals. A secondary "reference signal" phased locked loop circuit with a narrow loop bandwidth reduces reference noise and spurious sidebands with faster lock times than a comparable frequency locked loop.

In accordance with the present invention, a phase locked loop (PLL) frequency synthesizer includes a primary phase locked loop circuit having a voltage controlled oscillator (VCO) circuit and a programmable divider circuit for establishing a voltage controlled oscillator output and a reference signal output at a divide ratio such that the outputs are equal to a common phase comparison frequency. A secondary "reference signal" phase locked loop circuit is operatively connected to the primary phase locked loop circuit and operative for receiving and isolating an external reference signal used for the phase locked loop circuit. An oscillator generates a voltage controlled, clean reference signal. The secondary phase locked loop circuit filters and synchronizes this clean reference signal with the external reference signal for producing the reference signal output to the primary phase locked loop circuit.

In yet another aspect of the present invention, the phase locked loop (PLL) frequency synthesizer includes a filter within the secondary phase locked loop circuit for filtering the external reference signal and attenuating spurs that are outside the bandwidth of the secondary phase locked loop circuit. The filter is operative at about 2.5 Hz. The programmable divider circuit comprises chip registers that are programmable for establishing a desired divide ratio between the voltage controlled oscillator and reference signal output. A microcontroller is operatively connected to the chip registers for establishing the desired divide ratios. A frequency multiplier circuit is operatively connected to the voltage controlled oscillator for multiplying the frequency of any output signal from the voltage controlled oscillator.

In yet another aspect of the present invention, a printed wiring board supports the primary and secondary phase locked loop circuits. A plurality of isolation vias are formed preferably as through holes and isolate any circuit components of the primary and secondary phase locked loop circuits. A housing is matched as to its coefficient of thermal expansion with the printed wiring board and comprises a support member on which the printed wiring board is mounted. A housing cover has an interior surface. Channelization walls are formed by channelization on the interior surface and form isolated channels that receive individual circuit components when the housing cover is mounted on the support member. The channelization walls are juxtaposed against any isolation vias used for isolating individual circuit components when the housing cover is placed on the support plate.

A method aspect of the present invention is also disclosed and comprises the step of generating an output signal from the voltage controlled oscillator of a primary phase locked loop (PLL) circuit, which includes a programmably divided, voltage controlled oscillator output and a reference signal output at a divide ratio such that the outputs are equal to a common phase comparison frequency. The reference signal used for the phase locked loop circuit is isolated by filtering and synchronizing a clean reference signal with the external reference signal and producing the reference signal output to the primary phase locked loop circuit.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention provides a novel and unobvious phase locked loop frequency synthesizer and method for generating microwave and millimeter wave signals by implementing a voltage controlled oscillator-based, phase locked loop frequency synthesizer that can operate with a corrupted external reference clock, and yet generate a very accurate and relatively spur free signal output. The present invention is advantageous for wireless terrestrial and satellite communications where the transmission and reception sources are synchronized with a reference signal recovered from received communications data that may have been corrupted with noise and spurious signals. The circuit and method of the present invention provides faster lock times than a comparable and typical frequency locked loop circuit.

The present invention generates a relatively spur free, high frequency, local oscillator signal using a corrupted reference clock signal. It isolates this corrupted reference clock signal from the frequency synthesizer circuits to prevent corruption of the frequency source. Because of the improved performance, the voltage controlled oscillator output frequency can be multiplied to generate higher frequency, local oscillator signals which have very low spurious and harmonic signals. A secondary "reference signal" phased locked loop circuit having a narrow loop bandwidth reduces the reference noise and spurious sidebands with faster lock times than a comparable frequency locked loop.

Figure 1:
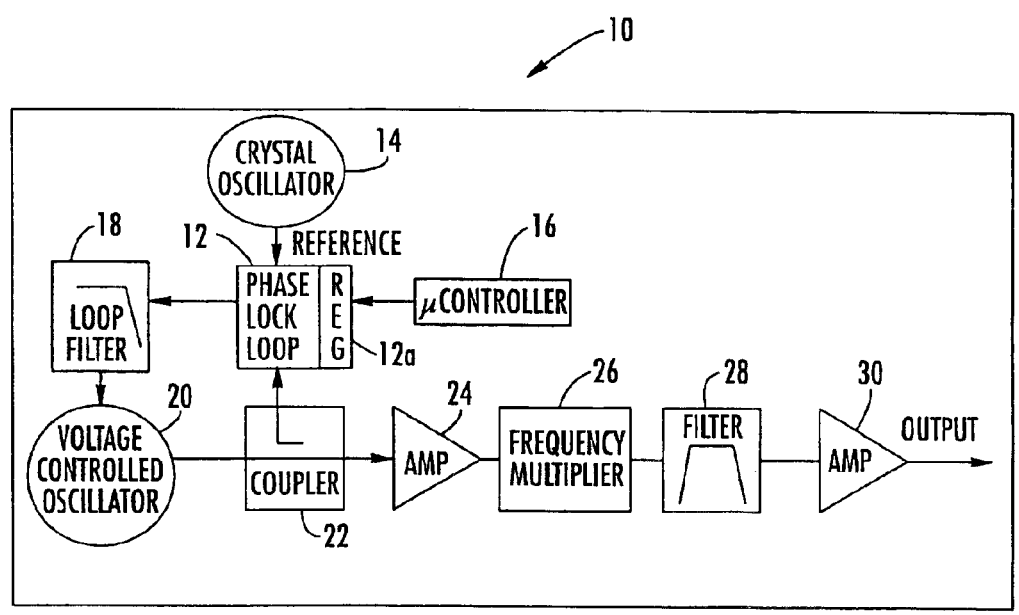
FIG. 1 is a block diagram of a prior art phased locked loop frequency synthesizer using a voltage controlled oscillator.

FIG. 1 illustrates a block diagram of a prior art voltage controlled oscillator-based phase locked loop frequency synthesizer 10. This type of frequency synthesizer 10 is widely available in the industry and has traditionally been used to generate high frequency sources by multiplying a voltage controlled oscillator output. The phase locked loop circuit at 12 is typically formed as a single phase locked loop semiconductor chip, which may include other circuit components known to those skilled in the art. A crystal oscillator 14 produces a voltage controlled reference signal. The phase locked loop circuit 12 includes a phase detector, as known to those skilled in the art, formed as part of the chip, and can include a frequency divider circuit that can be operative for dividing and/or multiplying as required, depending on signal output in some cases. A microcontroller 16 is operative with the phase locked loop circuit for controlling chip registers 12a that establish a desired divide ratio. The phase locked loop circuit 12 outputs a signal from the phase detector into a loop filter 18, which typically is a low-pass filter that passes signals only below the established cut-off frequency the loop circuit. The loop bandwidth is typically between 1.0 kHz and 2.5 kHz. This error signal becomes a varying DC level signal used to control the frequency of the voltage controlled oscillator.

The phase detector, as known to those skilled in the art, compares the two input signals. The signal output is taken from the voltage controlled oscillator 20 via a coupler 22 that loops back into the phase locked loop circuit 12 and the phase detector, typically formed as a single chip. The output from the voltage controlled oscillator 20 via coupler 22 is multiplied and passed into an amplifier 24 and frequency multiplier circuit 26 followed by a bandpass filter 28 to aid in filtering spurious signals. The signal then passes into a secondary amplifier circuit 30 and is output as the final, amplified and frequency multiplied signal.

The frequency synthesizer circuit 10 as shown in FIG. 1 provides a reliable method of generating low phase noise, local oscillator (LO) signals and uses a low noise, relative spur free crystal oscillator 14 source. A typical voltage controlled oscillator output frequency can be about 2.5 GHz, and may have a tunable bandwidth of up to approximately an octave. The phase locked loop circuit can be available as a single semiconductor chip that divides the coupled voltage control oscillator output by a factor "N", and divides the reference signal output by a factor "M", thus making the divided output equal as a common phase comparison frequency. The microcontroller 16 is used to program the phase locked loop chip registers 12a contained within the chip with the desired divide ratios (M and N). The crystal oscillator frequency is typically in the range of about 10 to about 100 MHz.

As known to those skilled in the art, the crystal oscillator is critical because the local oscillator output with phased noise and spur levels is a direct multiplication of the phase noise and spur levels of the reference signal inside the loop forming the circuit. The frequency multiplier is used to multiply the frequency of the voltage controlled oscillator output up to higher frequencies, and can be accomplished in single or multiple stages, depending on the actual frequency requirements.

In some prior art frequency synthesizers, the reference signal is generated as an external reference clock signal that is recovered from the received telecommunications date of wireless terrestrial or satellite communications. In these systems, the transmission and reception sources are required to be synchronized with the reference signal recovered from the received telecommunications data. Often, the external reference is corrupted with noise and spurious signals that have been part of the received data. Also, the use of a frequency locked circuit does not often provide adequate lock times.

The present invention isolates a corrupted reference clock signal from the frequency synthesizer circuits and prevents corruption of any frequency source. It generates a relatively spur free, high frequency local oscillator signal using this corrupted reference signal. It can generate high frequency, local oscillator signals with very low spurious and harmonic signals. It also allows faster lock times as compared to comparable, frequency locked loop circuits.

The present invention isolates the external reference signal that is recovered from the received data of a communications system that may have been corrupted with the noise and spurious signals. It generates a clean reference signal from a voltage controlled, temperature compensated crystal oscillator. The circuit filters and synchronizes this clean reference signal with the external reference signal within a secondary "reference signal" phase locked loop circuit to produce the reference signal output to the primary phase locked loop circuit.

Figure 2:
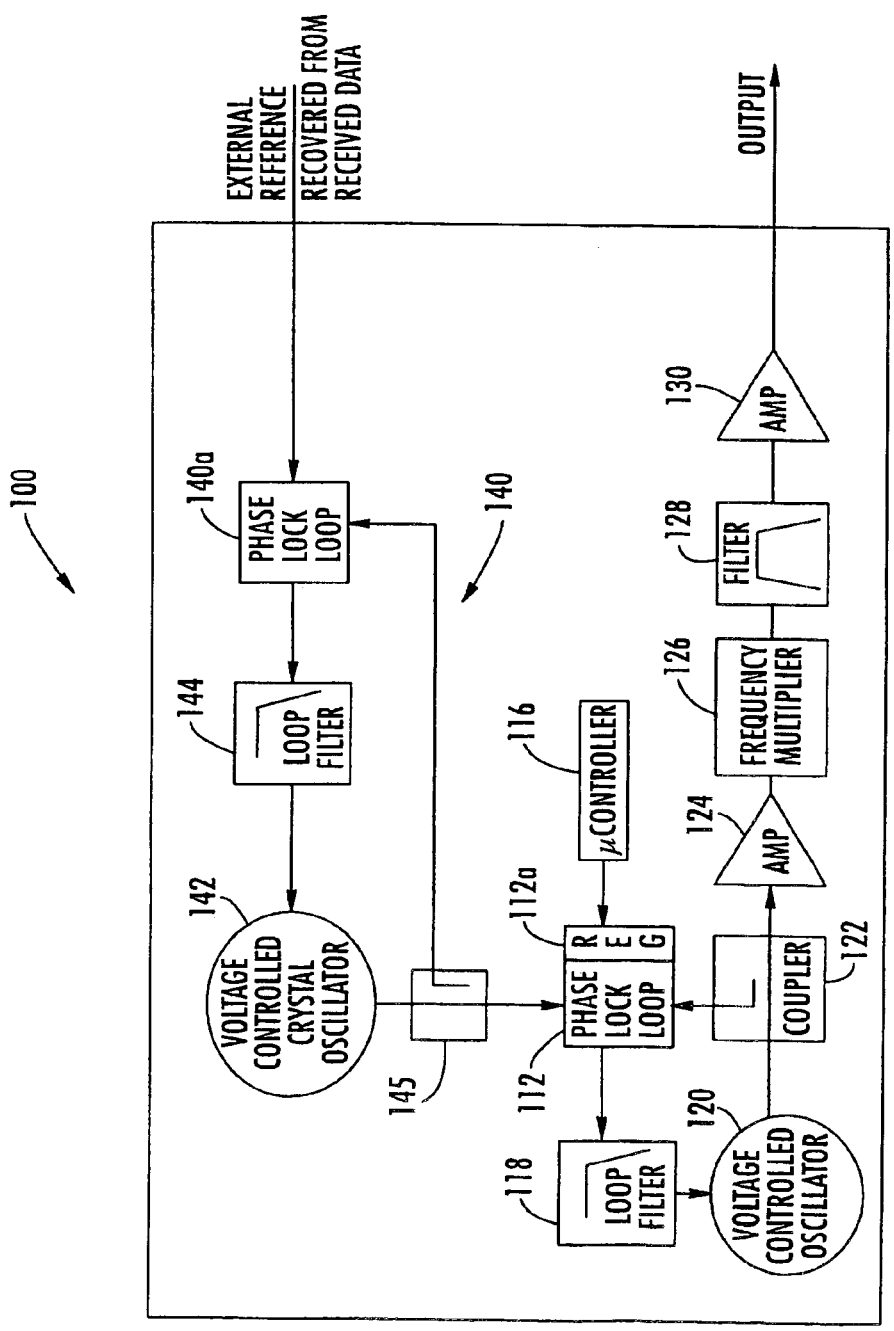
FIG. 2 is a block diagram of a phased locked loop frequency synthesizer in accordance with the present invention using a noisy external reference signal that is filtered and synchronized with a clean reference signal in a secondary phase locked loop circuit.

FIG. 2 shows a frequency synthesizer circuit of the present invention that can operate with a noisy external reference without degrading the in-band phase noise or spur levels. Those circuit components that are similar to the circuit components shown in FIG. 1 are given the same reference numeral with reference to FIG. 2, except in the 100 series, with the phase locked loop circuit 102 now termed a primary phase locked loop circuit.

As illustrated, the primary phase locked loop circuit 102 of the frequency synthesizer 100 shown in FIG. 2 is similar to the frequency synthesizer 10 shown in FIG. 1. What is improved is the addition to this frequency synthesizer 100 of a secondary "reference signal" phase locked loop circuit 140. This circuit has a narrow bandwidth to filter and synchronize a clean reference signal that is generated from an internal, voltage controlled, temperature compensated crystal oscillator 142 with the corrupted, external reference signal, which typically has been recovered from any received telecommunications data. Often, this data has been corrupted by noise and spurious signals.

The secondary phase locked loop circuit 140 may include various components necessary for practicing the invention, as suggested by those skilled in the art, including the major chip components of the phase locked loop chip circuit 140a, including a phase detector and any divider circuits formed as chip registers as necessary and suggested by those skilled in the art. A low bandwidth loop filter 144, such as approximately 2.5 Hz, attenuates all spurs outside the bandwidth of the phase locked loop. This secondary phase locked loop 140 has the ability to rapidly phase lock the internal crystal oscillator 142 to the external reference clock (less than 30 seconds has been measured), such that it is much faster than comparable, frequency locked loop circuits. A coupler 145 completes the loop circuit and forms the secondary phase locked loop circuit 140.

Figure 3:
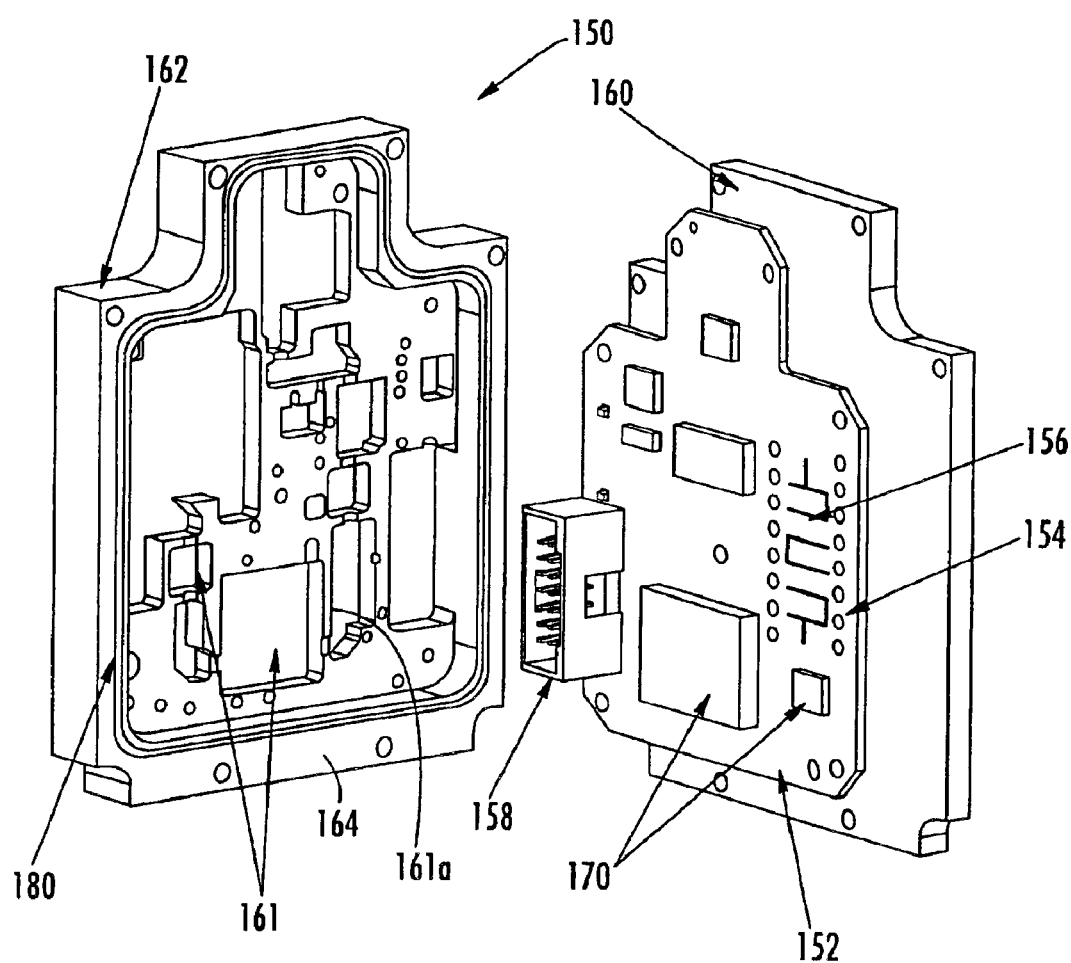
FIG. 3 is an exploded isometric view of a housing for the frequency synthesizer such as shown in FIG. 2, and showing the mechanical layout of various parts and components in accordance with the present invention.

It is possible to implement the circuit as shown in FIG. 2, using a housing 150 and printed wiring board (PWB) 152 as shown in FIG. 3, where the printed wiring board interfaces with the housing. The printed wiring board 152 can be formed as a synthesizer board and can be made from a soft board material, such as Rogers board from Rogers Corporation, as known to those skilled in the art. Each separate circuit section or chip, such as the chip components labeled 170, for example, is secured at appropriate circuit positions on the printed wiring board 152. These components could include the voltage controlled oscillators, phased locked loop circuits, filters and multipliers. The various circuits, chips and other components are isolated on the board through the use of isolation vias preferably formed as "through holes" that prevent unwanted signal propagation from one area of the board to another area of the board. This is shown by the filter 156 positioned on the printed wiring board and isolated from other sections, chips and components by isolation vias 154. Other components, including a DC connector 158 as known to those skilled in the art, are placed on the printed wiring board. The printed wiring board 152 is mounted on a support plate 160 forming a bottom cover of the housing 150.

The isolation that occurs between various circuits, chips and other components is further improved by creating isolated areas as "channels" or cut-outs 161, which are formed by channelization within the housing cover 162. The channels 161 correspond to the position of various components, i.e., chips, filters and other circuit components that are positioned on the printed wiring board. The channels 161 are positioned on the interior surface 164 of the housing cover 162 and include channelization walls 161a that are juxtaposed directly at the position where the isolation vias 154 are located on the soft, printed wiring board. This is critical to aid in achieving low phase noise and maintain frequency synthesizer output free of spurious and harmonic signals.

In one aspect of the present invention, the housing 150, including the support plate 160 and the housing cover 162, is made from a coefficient of thermal expansion (CTE) matched material having a similar coefficient of thermal expansion as the printed wiring board 152. For example, aluminum silicon has a coefficient of thermal expansion of about 17 and will be matched to a selected printed wiring board and housing material section. The use of a coefficient of thermal expansion matched housing reduces phase hits that are typically caused by having different rates of expansion in the housing and printed wiring board material versus the temperature. An EMI gasket 180 is positioned on the top cover and provides the additional seal between the top cover and support plate.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A phase locked loop (PLL) circuit, comprising:
   a primary phase locked loop circuit for establishing a reference signal;
   a secondary phase locked loop circuit operatively connected to the primary phase locked loop circuit for receiving, isolating and outputting a reference signal to the primary phase locked loop circuit;
   a board on which the primary and secondary phase locked loop circuits are positioned;
   a plurality of isolation vias formed in the board that isolate circuit components of the primary and secondary phase locked loop circuits; and
   a support member on which the board is mounted.

2. A phase locked loop (PLL) circuit according to claim 1, and further comprising a filter within the secondary phase locked loop circuit for filtering the reference signal and attenuating spurs that are outside the secondary phase locked loop bandwidth.

3. A phase locked loop (PLL) circuit according to claim 1, wherein said primary phase locked loop circuit comprises a voltage controlled oscillator (VCO) circuit and programmable divide circuit for establishing a voltage controlled oscillator signal and a reference signal at a divide ratio such that the signals are equal to a common phase comparison frequency.

4. A phase locked loop (PLL) circuit according to claim 3, wherein said primary phase locked loop circuit further comprises a frequency multiplier circuit operatively connected to said voltage controlled oscillator for multiplying the frequency of the signal from the voltage controlled oscillator.

5. A phase locked loop (PLL) circuit according to claim 3, and further comprising a processor operatively connected to said programmable divide circuit for establishing desired divide ratios between the voltage controlled oscillator and reference signals.

6. A phase locked loop (PLL) circuit according to claim 1, wherein said secondary phase locked loop circuit includes an oscillator for generating a voltage controlled, clean reference signal, wherein said secondary phase locked loop circuit filters and synchronizes the clean reference signal with an external reference signal.

7. A phase locked loop (PLL) circuit according to claim 1, wherein said board comprises a printed wiring board.

8. A phase locked loop (PLL) circuit according to claim 1, wherein said support is substantially matched as to its coefficient of thermal expansion with the board.

9. A phase locked loop (PLL) circuit according to claim 1, and further comprising a housing cover having an interior surface and channels on the interior surface that receive individual circuit components when the housing cover is mounted on the support.

10. A phase locked loop (PLL) circuit according to claim 3, and further comprising channelization walls that are juxtaposed against any isolation vias used for isolating individual circuit components.

11. A method of generating a high frequency signal which comprises:
   positioning circuit components of primary and secondary phase lock loop circuits on a board;
   isolating the circuit components using isolation vias;
   mounting the board on a support;
   generating a reference signal with the primary phase locked loop circuit;
   receiving and isolating a reference signal used for the primary phase locked loop circuit in a secondary phased locked loop circuit that is operatively connected to the primary phase locked loop circuit; and
   generating from the secondary phase locked loop circuit a reference signal to the primary phase locked loop circuit.

12. A method according to claim 11, which comprises filtering the external reference signal within the secondary phase locked loop circuit and attenuating any spurs that are outside the secondary phase locked loop circuit bandwidth.

13. A method according to claim 11, which comprises establishing a voltage controlled oscillator signal and a reference signal at a divide ratio such that signals are equal to a common phase comparison frequency.

14. A method according to claim 13, which comprises multiplying the frequency of the reference signal.

15. A method according to claim 13, which comprises establishing divide ratios between the voltage controlled oscillator signal and the reference signal using a processor.

16. A method according to claim 11, which comprises generating a voltage controlled, clean reference signal and filtering and synchronizing the clean reference signal with an external reference signal for producing a reference signal to the primary phase locked loop circuit.

17. A method according to claim 11, which comprises forming the board as a printed wiring board.

18. A method according to claim 11, which comprises matching the coefficient of thermal expansion of the support with the board.

19. A method according to claim 11, which comprises forming a housing cover having an interior surface and channels on the interior surface and receiving individual circuit components within the channels when the housing cover is mounted on the support.

20. A method according to claim 19, which comprises forming channelization walls that are juxtaposed against isolation vias for isolating individual circuit components.

* * * * *